(12) United States Patent
Hamilton et al.

(10) Patent No.: US 11,367,859 B2
(45) Date of Patent: Jun. 21, 2022

(54) CHIRAL PEROVSKITE QUANTUM DOTS FOR CIRCULARLY POLARIZED QLEDS AND METHOD OF MAKING THE SAME

(71) Applicant: SHARP KABUSHIKI KAISHA, Sakai (JP)

(72) Inventors: Iain Hamilton, Oxford (GB); Tim Michael Smeeton, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 252 days.

(21) Appl. No.: 16/739,574

(22) Filed: Jan. 10, 2020

(65) Prior Publication Data

US 2021/0217996 A1 Jul. 15, 2021

(51) Int. Cl.
| | |
|---|---|
| *H01L 51/52* | (2006.01) |
| *H01L 51/50* | (2006.01) |
| *H01L 51/00* | (2006.01) |
| *H01L 51/56* | (2006.01) |
| *C09K 11/06* | (2006.01) |

(52) U.S. Cl.
CPC ......... *H01L 51/5293* (2013.01); *C09K 11/06* (2013.01); *H01L 51/0007* (2013.01); *H01L 51/0028* (2013.01); *H01L 51/0077* (2013.01); *H01L 51/502* (2013.01); *H01L 51/56* (2013.01); *C09K 2211/18* (2013.01)

(58) Field of Classification Search
CPC ............. H01L 51/5293; H01L 51/0077; H01L 51/502
See application file for complete search history.

(56) References Cited

U.S. PATENT DOCUMENTS

| | | |
|---|---|---|
| 8,390,913 B2 | 3/2013 | Naitou et al. |
| 9,902,903 B2 | 2/2018 | Fuchter |
| 2017/0233645 A1 | 8/2017 | Zhong et al. |

FOREIGN PATENT DOCUMENTS

WO 2018/137558 A1 8/2018

OTHER PUBLICATIONS

Tingchao He et al.,"Spectroscopic studies of chiral perovskite nanocrystals" Appl. Phys. Lett. 111, 151102 (2017); Oct. 12, 2017.
Jiaqi Ma et. al., "Chiral 2D Perovskites with a High Degree of Circularly Polarized Photoluminescence" ACS Nano, 13, 3659-3665, 2019; Mar. 11, 2019.

*Primary Examiner* — Anthony Ho
(74) *Attorney, Agent, or Firm* — ScienBiziP, P.C.

(57) ABSTRACT

A light emitting device includes a first electrode, a second electrode, and an emissive layer between the first and second electrodes. The emissive layer comprises quantum dots that are capable of producing circularly polarized luminescence. The quantum dots are chiral structured perovskite quantum dots, each comprising a core having a chiral crystal structure.

18 Claims, 8 Drawing Sheets

US 11,367,859 B2

CHIRAL PEROVSKITE QUANTUM DOTS FOR CIRCULARLY POLARIZED QLEDS AND METHOD OF MAKING THE SAME

FIELD

The present disclosure relates to light-emitting devices, and in particular to light-emitting devices including an emissive layer containing quantum dots containing a chiral structure which allows for the emission of circularly polarized light. The light-emitting devices may be implemented in display applications, such as high resolution, multicolor displays. The present disclosure further relates to methods of manufacturing said chiral quantum dots, the circularly polarized light-emitting devices and the arrangements thereof.

BACKGROUND

A common architecture for a light-emitting device includes an anode, which acts as a hole injector; a hole transport layer disposed on the anode; an emissive material layer disposed on the hole transport layer; an electron transport layer disposed on the emissive material layer, and a cathode, which also acts as an electron injector, disposed on the electron transport layer. When a forward bias is applied between the anode and cathode, holes and electrons are transported in the device through the hole transport layer and electron transport layer, respectively. The holes and electrons recombine in the emissive material layer, which emits light.

When the emissive material layer includes an organic material, the light-emitting device is referred to as an organic light-emitting diode (OLED). When the emissive material layer includes nanoparticles, sometimes known as quantum dots (QDs), the device is commonly called either a quantum dot light-emitting diode (QLED, QD-LED) or an electroluminescent quantum dot light-emitting diode (ELQLED). QDs generally include ligands bound to outer surfaces of the QDs. The ligands enable the QDs to be solution processed, and may provide for the passivation of the surfaces of the QDs on which the ligands are bound.

Using quantum dots in the emissive layer may provide longer operating lifetime, operate at higher current densities and narrow spectral emission profiles for higher degree of color purity. Also, a wide range of different colors may be achieved by controlling the size and composition of the QDs. In addition, quantum dots may be solution processed, which is distinct from vacuum-deposited organic materials.

Current display technologies commonly incorporate a circular-polarizer layer to reduce backplane reflections of ambient light. The circular polarizer may comprise a linear polarizer and a quarter wavelength ($\lambda/4$) retarder. The circular polarizer is typically disposed between a cover window of a display, through which the user views the light emitted from the display, and the LED display (e.g. OLED, QLED). However, such a configuration may result in reduced efficiency of display because some emitted light is partially blocked by the circular-polarizer layer. Therefore, there is a need for QLEDs with the ability to directly produce circularly polarized light from the emissive layer to increase the efficiency of quantum dot based displays.

U.S. Pat. No. 9,902,903 B2 (Matthew Fuchter et al., published Feb. 27, 2018) describes a method of fabricating an OLED capable of producing circularly polarized light (CP-OLED) by blending in a chiral dopant molecule (helicene) into an emissive F8BT layer. Depending on the enantiomer of helicene used, the device can produce either left- or right-handed circularly polarized light.

International Patent Application Publication No. WO 2018/137558 A1 (Benzhong Tang et al., published Aug. 2, 2018) relates to a patent showing materials displaying strong circular dichroism, circularly polarized luminescence and high fluorescence quantum yields in an aggregated state. This is achieved by designing organic emitters such that side groups are not able to rotate—i.e. restriction of intramolecular rotation. This allows chiral conformers of materials to be realized, as well as allowing aggregate induced emission phenomena that can lend itself to high efficiency OLED displays.

U.S. Pat. No. 8,390,913 B2 (Masanobu Naitou et al., published Mar. 5, 2013) demonstrates a method of forming nanoparticles with chiral structures by preparing CdS nanoparticles inside a core of ferritin (a chiral protein). These nanoparticles exhibit a high degree of circularly polarized luminescence, thus demonstrating it is possible to form nanoparticles or quantum dots with chiral properties.

United States Patent Application Publication No. US 2017/0233645 A1 (Haizheng Zhong et al., published Aug. 17, 2017) demonstrates a method of preparing perovskite quantum dot materials. Here, quantum dot with a core of perovskite (of the type $ABX_3$) are formed whereby A is an organic material, B a heavy metal such as Pb or Sb, and X is a halide of the form Cl, Br or I. Long chain organic acids are used as the ligands.

Ma et al., *Chiral 2D Perovskites with a High Degree of Circularly Polarized Photoluminescence*, ACS Nano, 13, 3659-3665, 2019, describes a method of forming chiral perovskite materials (of the form $ABX_3$). Here, incorporating chiral organic components into the perovskite such as R-MBA or S-MBA produce chiral perovskites with circularly polarized luminescence of up to 17.6%. These perovskites were used successfully to detect polarized light.

CITATION LIST

He et al., *Spectroscopic studies of chiral perovskite nanocrystals*, Appl. Phys. Lett., 111, 151102, 2017, describes the fabrication of chiral perovskite nanocrystals by capping achiral, 3-dimensional perovskite nanocrystals with chiral ligands. These nanocrystals exhibit circular dichroism however the asymmetry factors are relatively weak.

U.S. Pat. No. 9,902,903 B2 (Matthew Fuchter et al., published Feb. 27, 2018).

International Pat. App. Pub. No. WO 2018/137558 A1 (Benzhong Tang et al., published Aug. 2, 2018).

U.S. Pat. No. 8,390,913 B2 (Masanobu Naitou et al., published Mar. 5, 2013).

U.S. Pat. App. Pub. No. US 2017/0233645 A1 (Haizheng Zhong et al., published Aug. 17, 2017).

Ma et al., *Chiral 2D Perovskites with a High Degree of Circularly Polarized Photoluminescence*, ACS Nano, 13, 3659-3665, 2019.

He et al., *Spectroscopic studies of chiral perovskite nanocrystals*, Appl. Phys. Lett., 111, 151102, 2017.

SUMMARY

The present disclosure is directed to chiral perovskite quantum dots for circularly polarized QLEDs and methods of making the same.

In accordance with a first aspect of the present disclosure, a light emitting device comprises a first electrode, a second electrode, an emissive layer between the first and second electrodes, where the emissive layer comprises quantum dots that are capable of producing circularly polarized luminescence.

In an implementation of the first aspect, the quantum dots each comprise a core having a chiral crystal structure.

In an implementation of the first aspect, the quantum dots are chiral structured perovskite quantum dots.

In another implementation of the first aspect, the quantum dots comprise only right handed circularly polarized perovskite quantum dot enantiomers.

In yet another implementation of the first aspect, the quantum dots comprise only left handed circularly polarized perovskite quantum dot enantiomers.

In yet another implementation of the first aspect, the quantum dots comprise a racemic mix of both right and left handed circularly polarized quantum dot materials.

In yet another implementation of the first aspect, the emissive layer comprises right handed circularly polarized perovskite quantum dots dispersed in a matrix of cross-linked charge transport molecules.

In yet another implementation of the first aspect, the emissive layer comprises left-handed circularly polarized perovskite quantum dots dispersed in a matrix of cross-linked charge transport molecules.

In yet another implementation of the first aspect, the emissive layer comprises a racemic mixture of left and right-handed circularly polarized perovskite quantum dots dispersed in a matrix of cross-linked charge transport molecules.

In yet another implementation of the first aspect, the quantum dots each comprise a chiral quantum dot core formed of octahedral metal halide lattices interspersed with one or more organic chiral ligands.

In yet another implementation of the first aspect, the light emitting device further comprises a circular polarizer disposed over the emissive layer.

In yet another implementation of the first aspect, the circular polarizer comprises a linear polarizer and a quarter wave ($\lambda/4$) retarder over the emissive layer.

In yet another implementation of the first aspect, the light emitting device further comprises a window and a circular polarizer between the window and the emissive layer, where the chiral crystal structure is configured so that light emitted from the emissive layer toward the window has a circular polarization that is substantially transmitted through the circular polarizer.

In yet another implementation of the first aspect, the light emitting device further comprises a circular polarizer disposed over the emissive layer, wherein the chiral crystal structure is configured so that light emitted from the emissive layer toward the first electrode has a first circular polarization such that the light after reflection by the first electrode has a second circular polarization that is not substantially transmitted through the circular polarizer.

In accordance with a second aspect of the present disclosure, a quantum dot comprises a core, and one or more shell layers around the core, where the core comprises a chiral crystal structure for producing circularly polarized luminescence.

In an implementation of the second aspect, the quantum dot is a chiral structured perovskite quantum dot.

In another implementation of the second aspect, the chiral crystal structure of the quantum dot comprises only right handed chiral structures to produce only right handed circularly polarized light.

In yet another implementation of the second aspect, the chiral structured perovskite quantum dot comprises only left handed chiral structures to produce only left handed circularly polarized light.

In yet another implementation of the second aspect, the chiral crystal structure of the quantum dot comprises a racemic mix of both right and left handed chiral structures to produce a mix of left and right handed circularly polarized light.

In yet another implementation of the second aspect, the core is formed of octahedral metal halide lattices interspersed with organic chiral ligands.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

DETAILED DESCRIPTION

Figure 1:
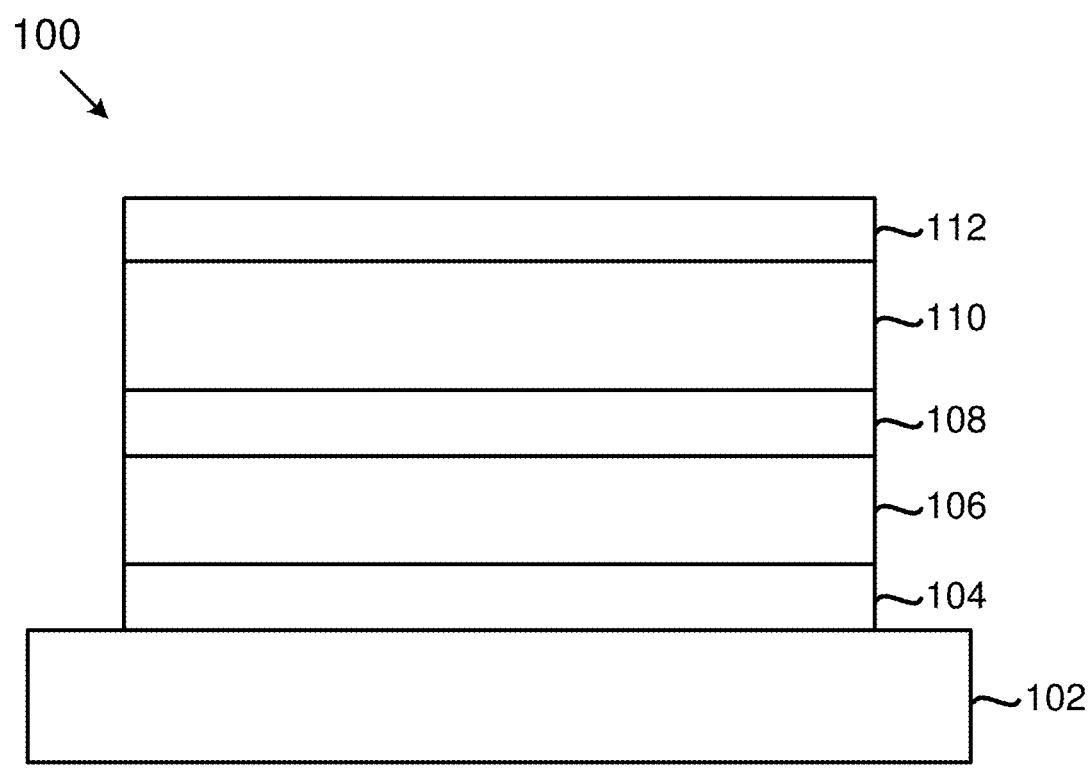
FIG. 1 is a schematic cross-sectional view of a light-emitting device in accordance with an example implementation of the present disclosure.

The following description contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purpose of consistency and ease of understanding, like features may be identified (although, in some examples, not shown) by the same numerals in the example figures. However, the features in different implementations may be differed in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates open-ended inclusion or membership in the so-described combination, group, series and the equivalent. The expression "at least one of A, B and C" or "at least one of the following: A, B and C" means "only A, or only B, or only C, or any combination of A, B and C."

Additionally, for the purposes of explanation and non-limitation, specific details, such as functional entities, techniques, protocols, standard, and the like are set forth for providing an understanding of the described technology. In other examples, detailed description of well-known methods, technologies, systems, architectures, and the like are omitted so as not to obscure the description with unnecessary details.

Circularly polarized (CP) light emitting devices have great potential in a wide range of applications, including highly efficient displays, stereoscopic 3-dimensional displays, optical quantum information processing and communications. Quantum dot light emitting diodes (QLEDs) in particular are a promising technology for use in displays because of longer operating lifetime, ability to operation at higher current densities, and narrow spectral emission profiles allowing for high color purity. In addition, quantum dots may be solution processed.

Combining circularly polarized emission with electroluminescence (CP-EL) from a QLED architecture remains an outstanding challenge. To date, no CP-EL has been demonstrated from a QLED. Using a chiral quantum dot for the emissive layer of a circularly polarized QLED provides several characteristics. Combining the color purity and high efficiency of quantum dots with circularly polarized emission opens up a wide array of possibilities within the display industry for very high efficiency and long lasting displays. The present disclosure provides a structure for a potential circularly polarized QD emitter type within the QLED device architecture to achieve CP-EL and methods of making said QLED device.

FIG. 1 is a schematic cross-sectional view of a light-emitting device 100 in accordance with an example implementation of the present disclosure. Several planar layers are disposed on a substrate 102. The layers include a first electrode 104, a first charge transport layer 106, an emissive layer 108, a second charge transport layer 110, and a second electrode 112.

In one implementation of the present disclosure, the light-emitting device 100 may have a general structure where the first electrode 104 may be an anode, the first charge transport layer 106 may be a hole transport layer, the second charge transport layer 110 may be an electron transport layer, and the second electrode 112 may be a cathode. In another implementation of the present disclosure, the light-emitting device 100 may have an inverted structure where the first electrode 104 may be a cathode, the first charge transport layer 106 may be an electron transport layer, the second charge transport layer 110 may be a hole transport layer, and the second electrode 112 is an anode. In another implementation, the light-emitting device 100 may be a bottom-emitting device where light is primarily emitted out of the substrate 102 side. In yet another implementation, the light-emitting device 100 may be a top-emitting device where light is primarily emitted out of the second electrode 112 side.

The substrate 102 may be made from any suitable material(s). Exemplary substrates may include rigid (typically made of glass) or flexible (including polyimide, polyethylene, polythene or polyester materials) substrates. Disposed on the substrate 102 is the first electrode 104 which can be described as an anode in the general structure or a cathode in the inverted structure. In the case of a bottom-emitting device, the first electrode 104 is transparent or semi-transparent. Exemplary materials for the first electrode 104 may include indium-doped tin oxide (ITO), fluorine doped tin oxide (FTO) or indium-doped zinc oxide (IZO). In the case of a top-emitting device, the first electrode 104 may be made of any suitable reflective metal such as silver. The second electrode 112 may be the final deposited layer in the stack of the light-emitting device 100. In bottom-emitting devices, the second electrode 112 is a reflective electrode. Exemplary materials for the second electrode 112 may include metals such as aluminium or silver as cathodes for the general structure, and gold or platinum as anodes for the inverted structure. Top-emitting devices may use a semi-transparent terminal electrode such as thin (<20 nm) silver, or a magnesium-silver alloy.

In a general structure of the light-emitting device 100, the first charge transport layer 106 is a hole transport layer deposited upon the first electrode 104. This may include one or more layers optimised to transport holes from the anode into the emissive layer 108. The hole transport layer may comprise any suitable material(s). In some implementations, the hole transport layer may include organic polymeric materials such as poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (poly-TPD), metal oxide materials for example $V_2O_5$, NiO, CuO, $WO_3$, $MoO_3$ or organic small molecule materials such as 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), and N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC). In implementations where the first charge transport layer 106 includes more than one layer, the materials of the respective layers may differ.

In a general structure of the light-emitting device 100, the second charge transport layer 110, which is disposed between the emissive layer 108 and the second electrode 112 is an electron transport layer. It may include one or more layers and may be made from any suitable materials that are optimized to transport electrons to the emissive layer 108. The electron transport layer(s) may include metal oxides such as ZnO, $Mg_xZn_{1-x}O$ where $0 \le x \le 1$, $Al_xZn_{1-x}O$ where $0 \le x \le 1$, $TiO_2$ and $ZrO_2$, organic small molecules such as 2,2',2"-(1,3,5-benzenetriyl)-tris(1-phenyl-1-H-benzimidazole) (TPBi), N4,N4'-Di(naphthalen-1-yl)-N4,N4'-bis(4-vinylphenyl)biphenyl-4,4'-diamine (VNPB), and 9,9-Bis[4-[(4-ethenylphenyl)methoxy]phenyl]-N2,N7-di-1-naphthalenyl-N2,N7-diphenyl-9H-Fluorene-2,7-diamine (VB-FNPD) and thin ionic interlayers such as 8-quinolinolato lithium (Liq.), LiF, $Cs_2CO_3$. Where more than one material is used, these materials may differ.

The light-emitting device 100 may include one or more additional layers. For example, a hole injection layer may be disposed between the anode and the hole transport layer and/or an electron injection layer may be disposed between the cathode and the electron transport layer. Materials suitable for use in a hole injection layer include, but are not limited to, poly(3,4-ethylenedioxythiophene) polystyrene sulfonate (PEDOT:PSS), MoO3:PEDOT:PSS; $V_2O_5$, $WO_3$, $MoO_3$, 2,3,5,6-tetrafluoro-7,7,8,8-tetracyanoquinodimethane (F4TCNQ), and/or 1,4,5,8,9,11-hexaazatriphenylene-hexacarbonitrile (HATCN). Materials suitable for use in an electron injection layer include, but are not limited to, 8-quinolinolato lithium (Liq), LiF, $Cs_2CO_3$ or a polyelectrolyte such as Poly(ethylenimine) (PEI) or poly(ethylenimine) ethoxylated (PEIE).

Figure 2:
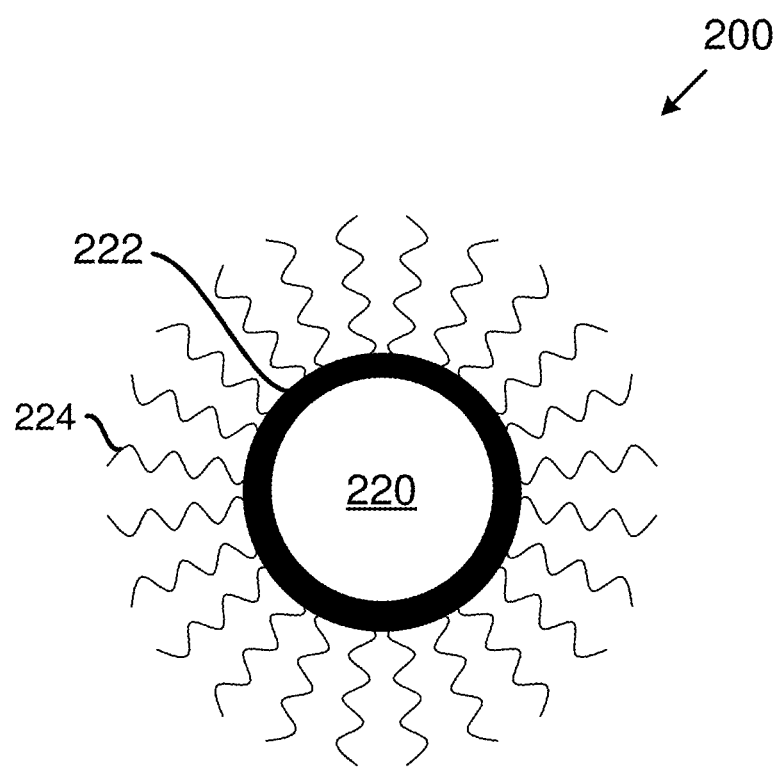
FIG. 2 is a schematic diagram of a quantum dot in accordance with an example implementation of the present disclosure.

The emissive layer 108 may include a compact layer of quantum dots (e.g., quantum dot 200 shown in FIG. 2). The emissive layer 108 is fabricated such that is sandwiched between the charge transport layers (CTLs) 106 and 110. The emissive layer 108 is where holes and electrons are both transported to, whereupon emission of photons from the quantum dots occurs. For example, an electron and a hole may form an exciton at a quantum dot that subsequently decays whilst emitting a photon. Quantum dots are nanoparticles comprising semiconducting material.

FIG. 2 is a schematic diagram of a quantum dot 200 in accordance with an example implementation of the present disclosure. Examples of suitable quantum dots 200 are particles including one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_{1-x}Te_x$, $ZnSe_{1-x}Te_x$, perovskites of the form $ABX_3$, $Zn_wCu_zIn_{1-(w+x)}S$, where 0≤w, x, y, z≤1 and (w+z)≤1, and carbon. It is understood that these materials may include other elements as dopants or alloys. For example, a quantum dot including InP may include a material substantially comprising InP but also including As and/or other elements as dopant or alloy components. As an example, the quantum dot 200 may include a core 220 and one or more shell layers 222 around the core 220. In other implementations, the quantum dots 200 may include the core 220, one or more shell layers 222 around the core 220, and an oxide layer (e.g. an $Al_2O_3$ layer or a layer of another suitable metal oxide). In some implementations, the quantum dot 200 may have a dimension (e.g., the diameter) less than 20 nm. Ligands 224 may be attached to the quantum dot 200 but are external to the quantum dot 200.

Figure 3:
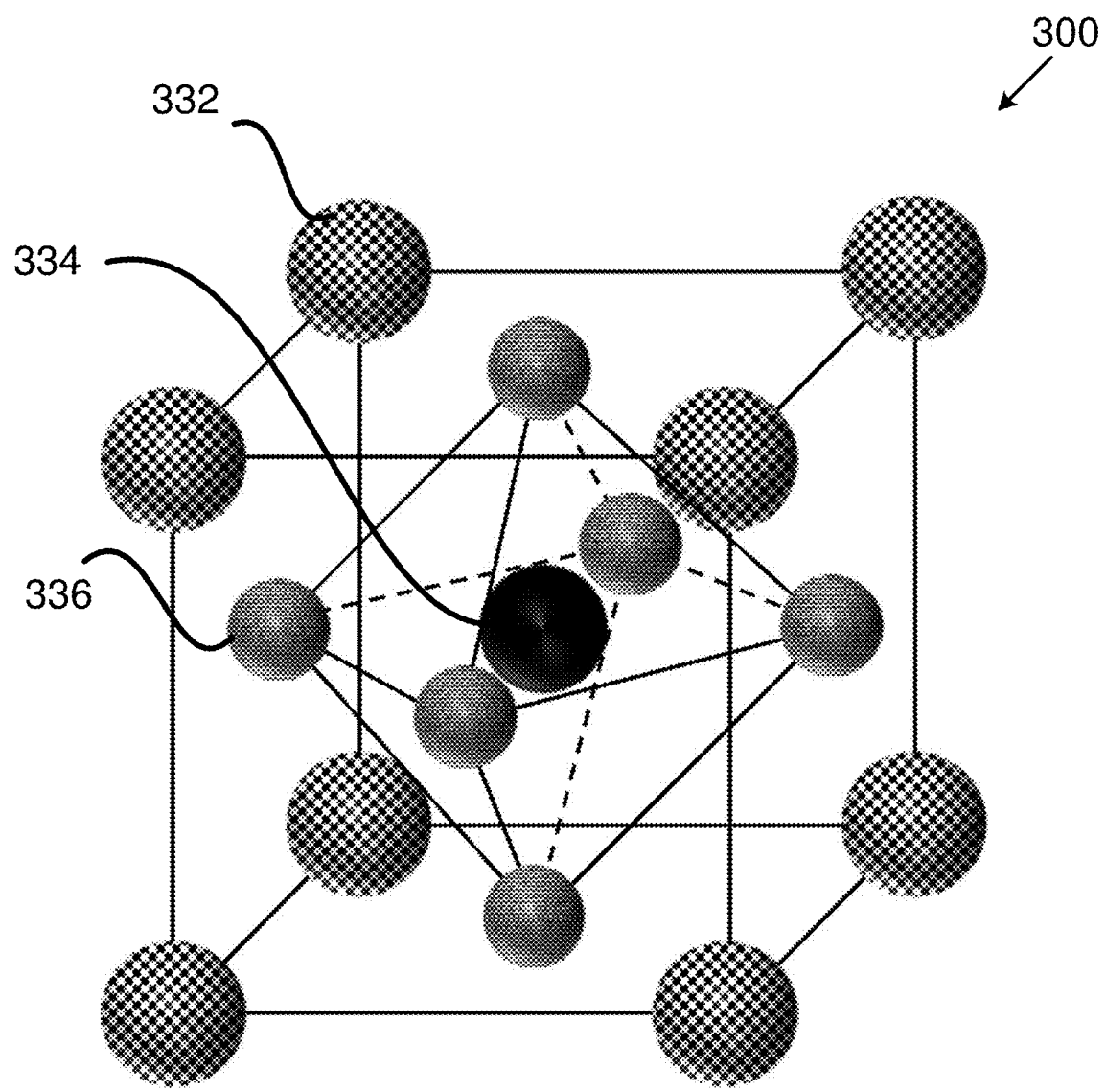
FIG. 3 illustrates a schematic diagram of a coordinated structure of a core of a quantum dot in accordance with an example implementation of the present disclosure.

FIG. 3 illustrates a schematic diagram of a coordinated structure of a core of a quantum dot in accordance with an example implementation of the present disclosure. In FIG. 3, A, B and X ions form a coordinated structure 300 in a core of a quantum dot (e.g., the core 220 of the quantum dot 200 in FIG. 2). In some implementations of the present disclosure, the quantum dots may include an inorganic-organic hybrid perovskite material. The quantum dot material may include: the core of organic-inorganic perovskite material of the form $ABX_3$, where A is an organic cation 332 of the form R—$NH_3$ where R is an organic group, B is a heavy metal cation 334 and X is a halide anion 336. Referring to FIG. 3, the halide anions 336 form an octahedral structure around the heavy metal cation 334. The organic cations 332 complete the coordinated structure 300 by forming a cubic structure around the heavy metal cation 334. The quantum dot may be then surrounded by the organic ligands (e.g., ligands 224 in FIG. 2) such as an organic acid, amine or thiol. One ends of the organic ligands 224 are adsorbed onto surfaces of the core 220 via Van der Waals force, another ends of the organic ligands 224 diverge away from the surfaces of the core 220. In some implementations, the ends of the organic ligands 224 diverging away from the surfaces of the core 220 may restrict growth of the quantum dot 200 to keep the size (e.g., the diameter) of the quantum dot under 20 nm. Examples of the organic ligands 224 used in the perovskite quantum dot 200 may include: oleic acid (OA), oleylamine (OLAM) and dodecanethiol (DDT). Typical B type heavy metal cations 334 can be: Pb, Sn, Sb, Bi, Mn and Ge. The halide anions (X) 336 can be chosen from one of either Cl, Br or I ions. Typical A type organic cations 332, in perovskite structures may include methylammonium ($CH_3NH_3$) and formamidinium ($CH_5N_2$). Inorganic cations such as Cs can also be used in place of the organic cations 332. In various implementations of the present application, Type A cations and organic cations may be used interchangeable, and Type B cations and heavy metal cations may be used interchangeable.

Figure 4:
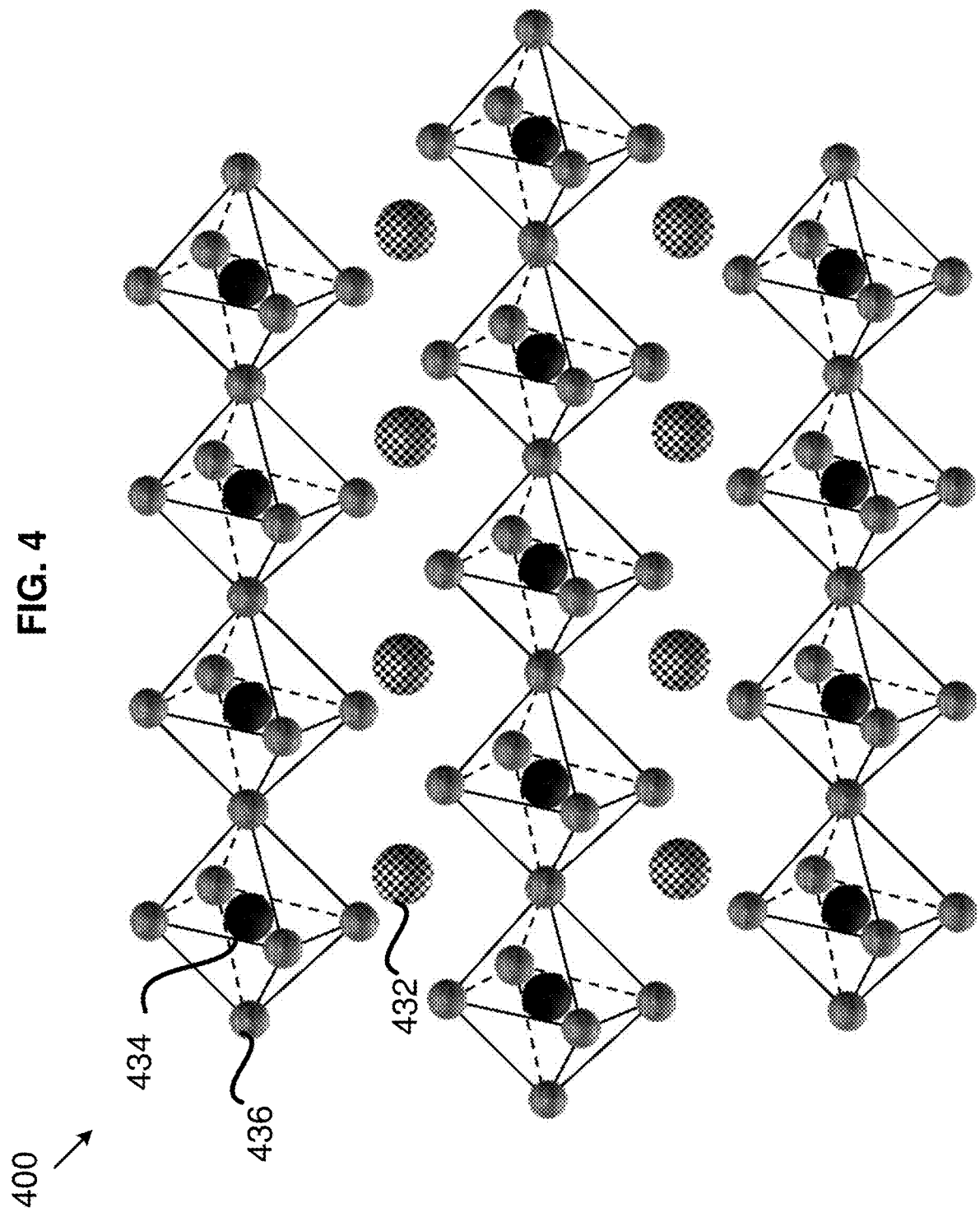
FIG. 4 illustrates a schematic diagram of a crystal structure of a core of a quantum dot with chirality according to the present disclosure.

FIG. 4 illustrates a schematic diagram of a crystal structure 400 of a core of a quantum dot with chirality according to the present disclosure. The crystal structure 400 of the quantum dots is organic-inorganic perovskite material $ABX_6$, wherein A is an organic cation 432, B is a heavy metal cation 434, and X is a halide anion 436. Chirality is induced within a perovskite by using an organic cation 432 having a chiral center. Exemplary materials for the A type organic cation 432 may include R- or S-type methylbenzylamine (MBA), R- or S-type aminohexane or R/S-type aminoindane. Here, each octahedral unit $[BX_6]^{4-}$ shares a corner occupied by the halide anion 436, and between layers of the octahedral units $[BX_6]^{4-}$ are sandwiched by A type ion organic chains formed by the organic cations 432 which have chirality. The octahedral units $[BX_6]^{4-}$ are held together by Van der Waals forces. A quantum well structure is formed with the chiral ion organic chains embedded therein. In some implementations, the chiral organic chains can be left-handed (S) enantiomers. In other implementations, the chiral organic chains can be right-handed (R) enantiomers. This endows the resultant crystals with chirality due to the chirality transfer from chiral organic chains to the octahedral units. This results in a perovskite quantum dot with a chiral crystal structure core. The chiral structure is formed by first forming octahedral units made up of $[BX_6]^{4-}$ that form crystal 'layers'. These octahedral layers are then sandwiched by layer of organic chiral cations (Type A cations) which is naturally formed in solution forming a multi-quantum well structure. The chirality of the organic cations is transferred to the resultant crystal structure by offsetting subsequent octahedral layers from each other.

In some implementations, the quantum dots may include a racemic mix of both right and left handed circularly polarized quantum dot materials. For example, the emissive layer may comprise a racemic mixture of left and right-handed circularly polarized perovskite quantum dots dispersed in a matrix of cross-linked charge transport molecules.

Figure 5:
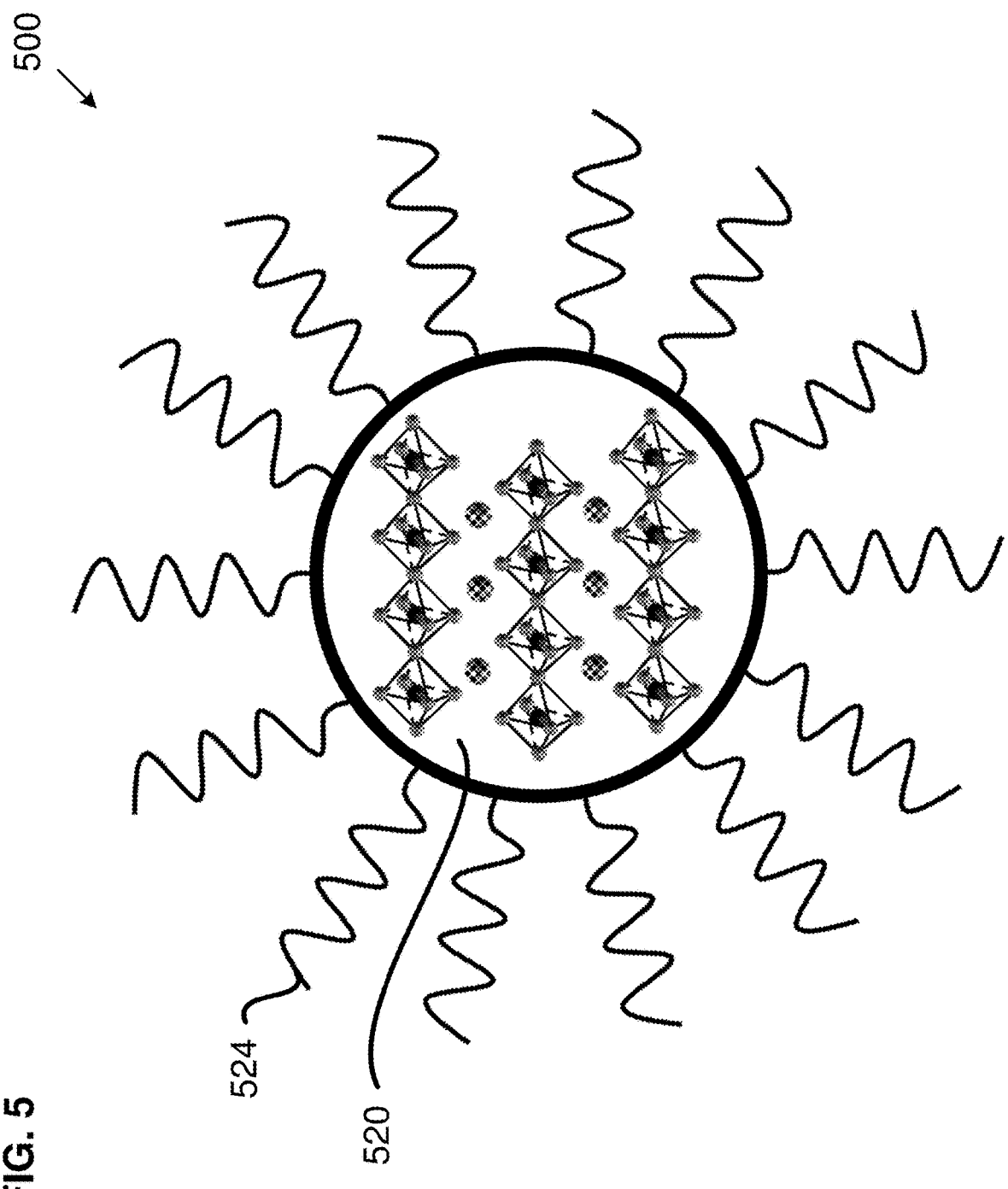
FIG. 5 illustrates a schematic diagram of a chiral perovskite quantum dot having a crystal structure in a core and with organic ligands attached thereon in accordance with an example implementation of the present disclosure.

FIG. 5 illustrates a schematic diagram of a chiral perovskite quantum dot 500 having a crystal structure in a core and with organic ligands attached thereon in accordance with an example implementation of the present disclosure. In FIG. 5, the chiral perovskite quantum dot 500 includes a chiral perovskite core 520 having a crystal structure substantially similar to the crystal structure 400 in FIG. 4. The chiral perovskite quantum dot 500 includes organic ligands 524 attached thereon in the implementation shown. The addition of long chain organic ligands 524 to the surface of the chiral perovskite core 520 may further produce a solution processable, high quantum yield chiral perovskite quantum dot 500.

Comparing with using a conventional core with chiral ligands, the implementations of the present disclosure use the chiral perovskite core 520 which may produce a much higher dissymmetry factor and thus increase the efficiency of a QLED used within a display.

A method of producing material of the chiral perovskite quantum dot 500 according the present disclosure is described as follows.

Dissolving an inorganic metal halide ($BX_y$) and an organic ammonium halide ($AX_y$) in a first solvent to obtain a precursor solution, in which both the inorganic metal halide and the organic ammonium halide exist in the form of free molecules. The organic ammonium halide may include a chiral organic ammonium group of either a left (S) or a right (R) handed form. An example of a first solvent may be one or more from N,N-dimethyl formamide (DMF), dimethyl sulfide (DMSO), tetrahydrofuran (THF), acetonitrile (ACN) and acetone.

Dropping the precursor solution into a second solvent dropwise, wherein the solubility of the inorganic metal halide and the organic ammonium halide in the first solvent is different from that in the second solvent, thereby the inorganic metal halide and the organic ammonium halide are self-assembled. Examples of a second solvent may include one or more from toluene, chloroform, octane, chlorobenzene and ethyl acetate. The coordinated octahedral structure comprising the octahedral units $[BX_6]^{4-}$ is formed by the heavy metal cation 334/434 of the metal halide and the halide anions 336/436 of the organic ammonium halide. The organic ammonium cations 332/432 of the organic ammoniumhalide become embedded in the quantum wells of the octahedral units $[BX_6]^{4-}$ and material of the cores of the perovskite quantum dot material is hereby obtained.

In one implementation, prior to dropping the precursor solution into the second solvent, organic ligands 524 are added in advance to either the first solvent or the second solvent, and the organic ligands 524 are long chain organic amine or long chain organic thiol with an alkyl or aryl group, in an organic acid. An organic amine with an appropriate long chain organic ligand structure can be selected according to different inorganic metal halides being chosen; thereby various materials of the chiral perovskite quantum dot 500 may be formed. The method of making the quantum dot material may result in a relatively high fluorescence quantum yield.

The mechanism for making the chiral perovskite quantum dot material is that both the inorganic metal halide and the organic ammonium halide are soluble in the first solvent as free molecules. When the precursor solution is dropped into the second solvent, the inorganic metal halide and the organic ammonium halide will self-assemble. The heavy metal cation 334 and halogen anions may form the coordinated octahedral structure $[BX_6]^{4-}$, and the chiral organic ammonium cations may enter into gaps of the coordination octahedral structure $[BX_6]^{4-}$ to form the chiral hybrid perovskite structure $ABX_3$. The long chain organic ligands 524 in the solution will be adsorbed onto surfaces of the chiral perovskite cores 520 comprising the chiral hybrid perovskite structure $ABX_3$. The long chain organic ligands 524 may restrict the growth of the chiral perovskite core 520 to less than 20 nm (e.g., in diameter) and result in the formation of the chiral perovskite quantum dot 500.

In some implementations, chiral perovskite quantum dots (e.g., chiral perovskite quantum dots 500) with different luminescence wavelengths may be produced by adjusting the ratio of the inorganic halide to the long chain organic amines. In a method according to the present disclosure, the organic ligands may be added to the first solvent or to the second solvent. The chiral perovskite cores are stabilized with the organic ligands attached to the surfaces thereof and thus may be dispersed in the second solvent. This facilitates the processing of the perovskite quantum dots, and the perovskite quantum dot material can be obtained by removal of organic solvents by distillation. The chiral perovskite quantum dots may then be re-dispersed in any suitable solvent that can dissolve the perovskite quantum dot material.

Figure 6:
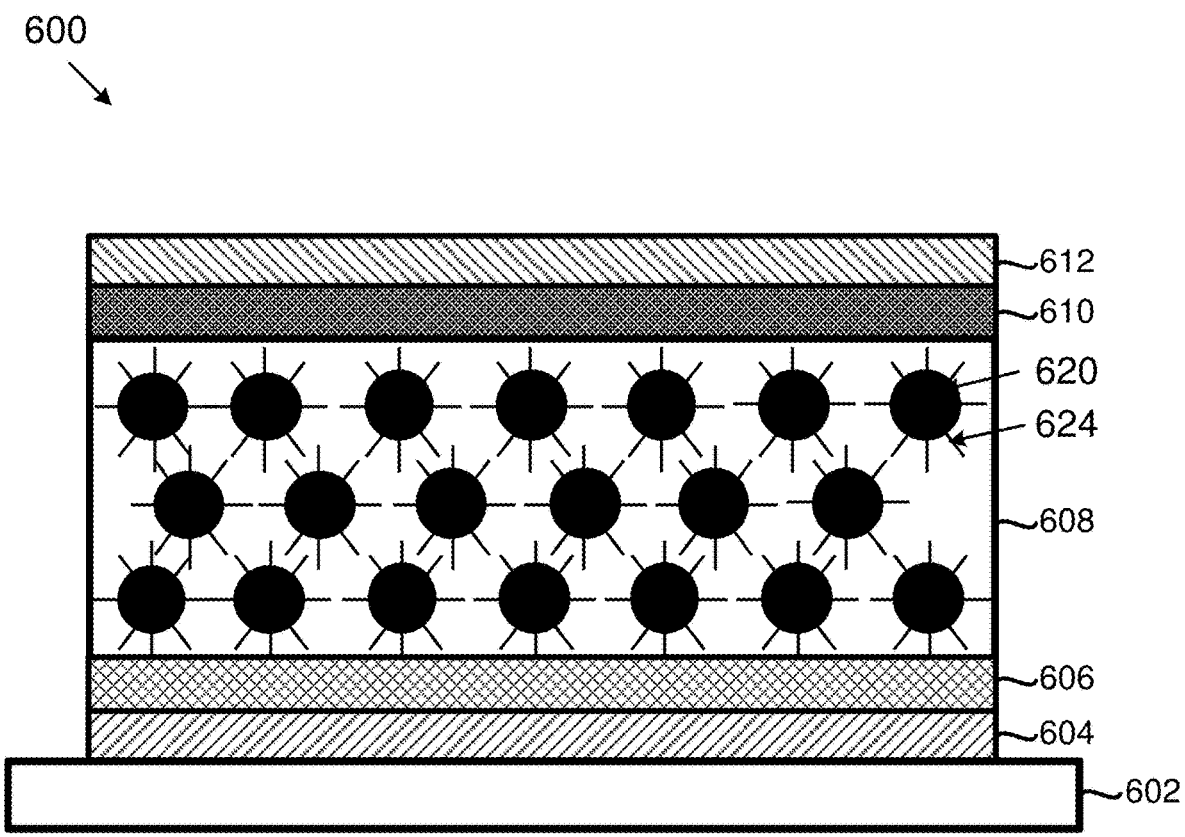
FIG. 6 illustrates a schematic cross-sectional view of a light-emitting device comprising an emissive layer having chiral perovskite quantum dots in accordance with an example implementation of the present disclosure.

Referring to FIG. 6, FIG. 6 illustrates a schematic cross-sectional view of a light-emitting device 600 (e.g., a QLED) comprising an emissive layer 608 having chiral perovskite quantum dots 620 in accordance with an example implementation of the present disclosure. In FIG. 6, the chiral perovskite quantum dots 620 may then be incorporated into the emissive layer 608 within a circularly polarized quantum dot light emitting device 600 (e.g., a QLED). The circularly polarized quantum dot light emitting device 600 comprises planar layers disposed on a substrate 602 in the following order: a first electrode 604, a first charge transport layer 606, an emissive layer 608, a second charge transport layer 610, and a second electrode layer 612. In the implementation of FIG. 6, a plurality of ligands 624 is attached to the surface of each chiral perovskite quantum dot 620.

In the implementation as shown in FIG. 6, the emissive layer 608 is a compact layer of chiral perovskite quantum dots 620. The chiral perovskite quantum dots 620 can be deposited on top of the first charge transport layer 606, via a solution processed method such as spin coating, drop casting, inkjet printing, wire bar coating, spray coating or doctor blading.

Figure 7A:
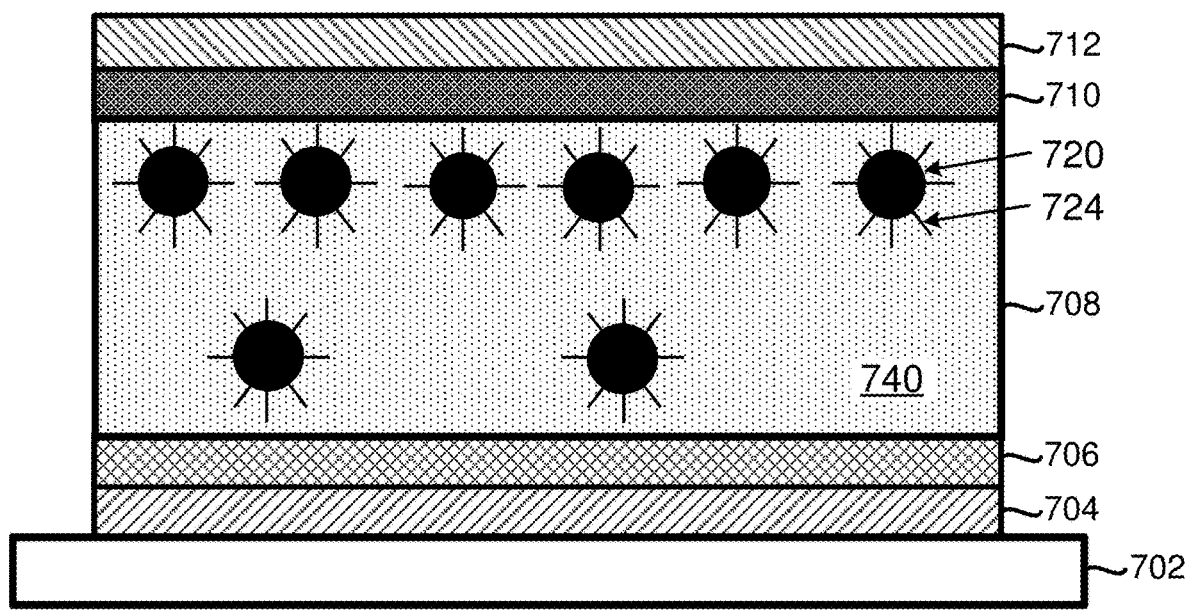
FIG. 7A is a schematic cross-sectional view of a light-emitting device comprising an emissive layer having chiral perovskite quantum dots of different colours within a cross-linked charge transport matrix in accordance with an example implementation of the present disclosure.

FIG. 7A is a schematic cross-sectional view of a light-emitting device 700 comprising an emissive layer having chiral perovskite quantum dots within a cross-linked charge transport matrix in accordance with an example implementation of the present disclosure. In FIG. 7A, the circularly polarized light-emitting device 700 (e.g., a QLED) comprises planar layers disposed on a substrate 702 in the following order: a first electrode 704, a first charge transport layer 706, an emissive layer 708, a second charge transport layer 710, and a second electrode layer 712. A plurality of ligands 724 is attached to the surface of the chiral perovskite quantum dots 720.

To fabricate high resolution displays, the chiral perovskite quantum dots 720 that emit different colours may be selectively deposited in a pattern on one substrate. Therefore, in some implementations, the chiral perovskite quantum dots 720 of different colours may be blended with a cross linkable charge transport material. Suitable material for the cross linkable charge transport material can be N4,N4'-Bis(4-(6-((3-ethyloxetan-3-yl)methoxy)hexyl)phenyl)-N4,N4'-diphenylbiphenyl-4,4'-diamine (OTPD) to allow for patterning of the emissive layer 708. In the implementation according to FIG. 7B, a solution of the emissive layer comprises chiral perovskite quantum dots 720, cross-linkable charge transport material (e.g., charge transport molecules 742 in FIG. 7B), and any suitable photo initiator such as p-octyloxyphenyl-phenyl iodonium hexafluoroantimonate (OPPI). An intermediate emissive layer is then exposed to UV light through a mask that provides a shape and/or a pattern through which the desired area of the layer is exposed. Exposure of the intermediate emissive layer to UV light results in the charge transport material becoming cross-linked and forming a cross-linked matrix (e.g., a cross-linked charge transport matrix 740 in FIG. 7B). In implementations where the solution of the emissive layer 708 includes photo-initiator, the photo-initiator may assist in initializing the cross-linking of the charge transport material. The cross-linking of the charge transport material results in dispersion of the chiral perovskite quantum dots 720 throughout the cross-linked charge transport matrix 740 after the charge transport material is exposed to UV light. The cross-linked charge transport matrix 740 of the emissive layer 708 is insoluble. The remaining solution which is not exposed UV light may be washed away with a solvent. In some implementations, the solvent is the same solvent used in the solution that is deposited. In other implementations, the solvent is a similar solvent or orthogonal solvent to the solvent used in the solution of the emissive layer 708 that is deposited. Accordingly, the cross-linked emissive layer 708 remains on the first electrode 704.

Figure 7B:
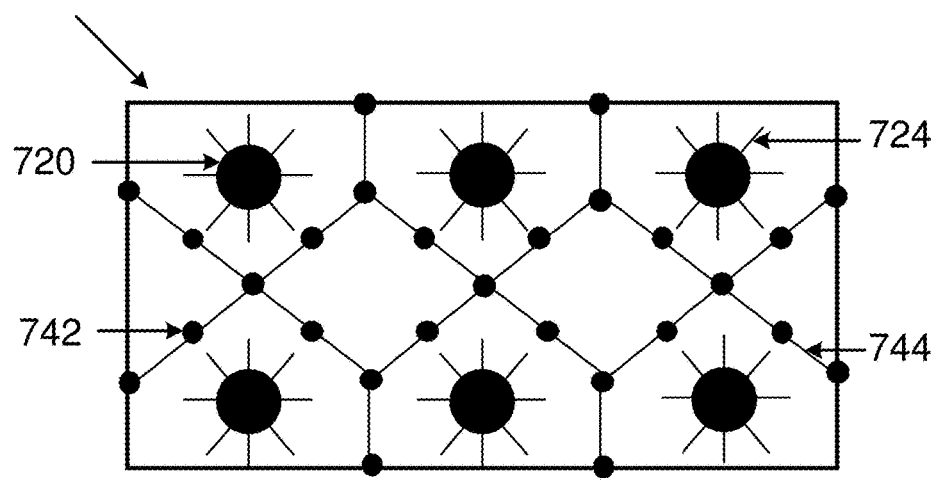
FIG. 7B is a schematic diagram of a cross-sectional view of a charge transport matrix having chiral perovskite quantum dots dispersed therein in accordance with an example implementation of the present disclosure.

As shown in FIG. 7B, the chiral perovskite quantum dots 720 are dispersed in the cross-linked charge transport matrix 740 which is a solid form of the charge transport material. Covalent bonds 744 are formed between the charge transport molecules 742 in the charge transport material. The above processes of depositing and UV light treating can be repeated to form a pattern of red, green and blue areas, respectively, of the circularly polarized chiral perovskite quantum dots 720.

In some implementations where chiral quantum dots are incorporated in a cross-linked matrix, the emissive layer may be fabricated by combining the photolithography process and the curing process. In other implementations, wherein the emissive layer may include neat quantum dots (e.g., quantum dots without a cross-linked matrix but still retain chirality), the curing process may be carried out. The curing steps may facilitate evaporation/removal of the solvent(s) in any of the implementations. The annealing may be performed at any suitable temperature that effectuates evaporation of the solvent while also maintaining the integrity of the quantum dots, the underlying emissive layer and charge transport material. In some implementations, annealing may be performed at a temperature ranging from 5° C. to 150° C. In other implementations, annealing may be performed at a temperature ranging from room temperature (18° C., also known as slow dry) to 80° C. As shown in FIG. 7B, the individual charge transport molecules 742 are shown as linked to each other via covalent bonds 744, whilst the chiral perovskite quantum dots 720 are dispersed within the cross-linked charge transport matrix 740.

Figure 8:
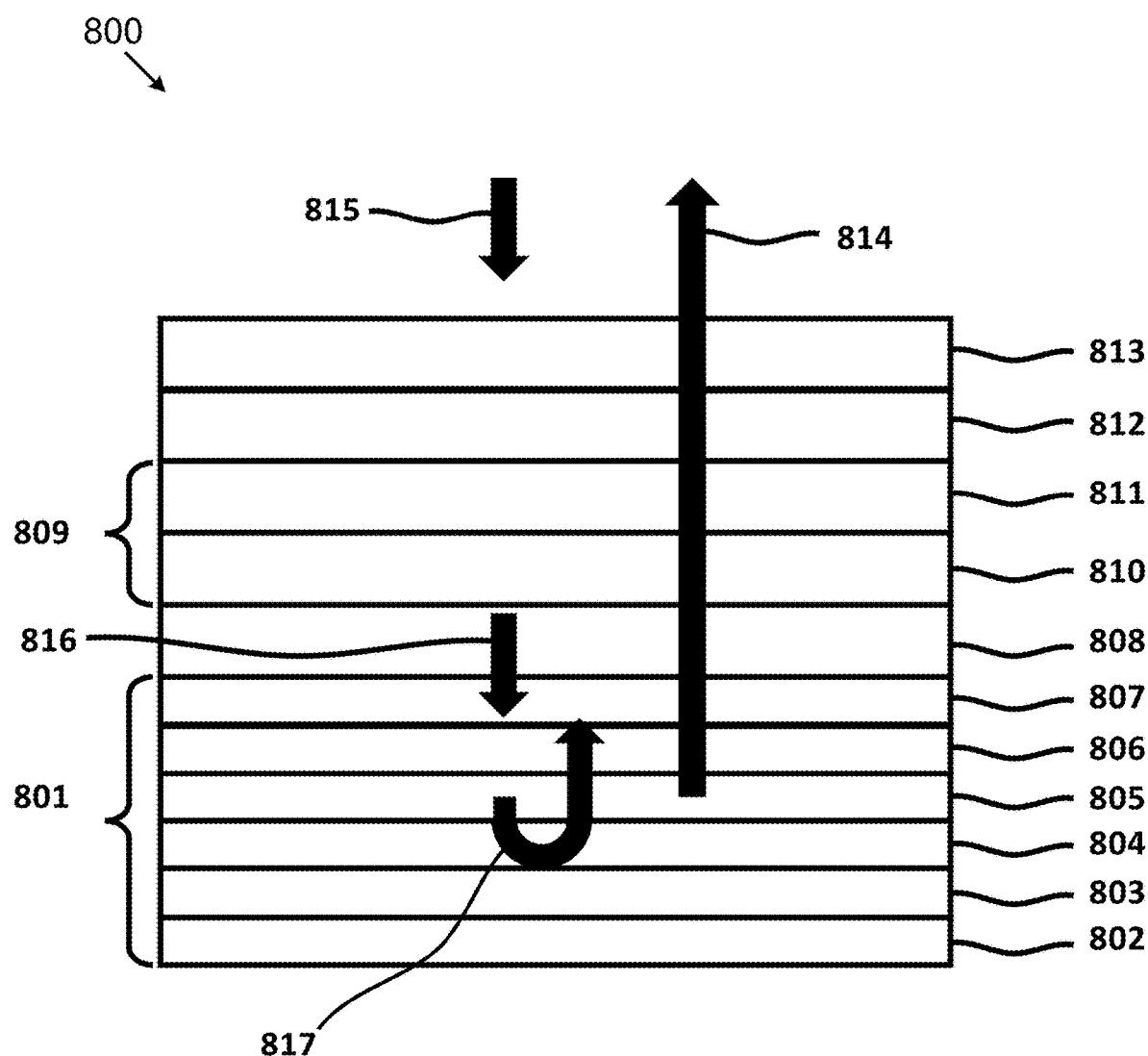
FIG. 8 is a schematic diagram of an example appliance having a light emitting device in accordance with an example implementation of the present disclosure.

FIG. 8 is a schematic diagram of an example appliance having a light emitting device in accordance with an example implementation of the present disclosure. An appliance 800 comprises a light emitting device 801 which may be according to any implementation described in the present disclosure. The light emitting device 801 comprises a substrate 802, a first electrode 803 disposed on the substrate 802, a first charge transport layer 804 disposed on the first electrode 803, an emissive layer 805 comprising quantum dots that are capable of producing circularly polarized luminescence disposed on the first electrode, a second charge transport layer 806 disposed on the emissive layer 805, and a second electrode 807 disposed on the second charge transport layer 806. The appliance 800 further comprises a circular polarizing element (e.g., a circular polarizer) 809. The circular polarizing element 809 may comprise a linear polarizer 810 and a quarter wave (λ/4) retarder 811 which is disposed on the linear polarizer 810. When unpolarized light is incident first on the linear polarizer 810, light which propagates through both the linear polarizer 810 and then the quarter wave (λ/4) retarder 811 has at least substantially a circular polarization. The circular polarizing element 809 may be joined to the light emitting device 801 by an optical adhesive layer 808 (e.g., an optically clear adhesive). The appliance 800 may further comprise a window 813 which is substantially transparent for wavelengths of light that are emitted by the light emitting device 801, for example a silica glass window or a polyimide window. The window 813 may be joined to the circular polarizing element 809 by an optional adhesive layer 812 (e.g., an optically clear adhesive). The light emitting device 801 may be a display device comprising a plurality of sub-pixels each comprising a QLED configured to operate as an active matrix QLED (AMQLED) by way of a thin film transistor (TFT) backplane. The appliance 800 may include other layers, such as functional layers, for example, disposed between the light emitting device 801 and the circular polarizing element 809 or between the circular polarizing element 809 and window 813. For example, a layer which functions as a touch sensor may be disposed between the aforementioned layers.

Among other advantages, the appliance 800 has low reflectivity to external ambient light 815 that is incident on the appliance 800. As shown in FIG. 8, external ambient light 815 which is incident on the window 813 propagates through the circular polarizing element 809 as propagated light 816 before it is incident on the second electrode 807 and first electrode 803. The propagated light 816 has substantially a first circular polarization which is determined by the configuration of the circular polarizing element 809 (e.g., a circular polarizer). In the present example shown in FIG. 8, the propagated light 816 has a left-handed circular polarization. The propagated light 816 may be reflected as reflected light 817, for example reflected at the second electrode 807 or reflected at the first electrode 803 (the example of reflection at the first electrode 803 is illustrated in FIG. 8). Owing to the reflection, the reflected light 817 has substantially a second circular polarization which is different from the first circular polarization. In the present example shown in FIG. 8, the reflected light 817 has a right-handed circular polarization. The reflected light 817 with the second circular polarization is not substantially transmitted through the circular polarizing element 809. Therefore, the reflection of external ambient light 815 by the appliance 800 is low. This is advantageous, for example when viewing the emitted light 814 in a bright ambient, for example under illumination by sunlight.

Furthermore, the appliance 800 is a high efficiency of extraction of the emitted light 814 which is emitted from the light emitting device 801. The emissive layer 805 comprises quantum dots which are configured so that the emitted light 814 which is emitted from the emissive layer 805 towards the window 813 has substantially the first circular polarization which is mostly transmitted through the circular polarizing element 809 (in the present example a left-handed circular polarization). The chiral structure of the quantum dots in the emissive layer is configured to provide the emission and circular polarization. Preferably the emitted light 814 which is emitted from the emissive layer 805 towards the first electrode 803 has substantially the second circular polarization such that, after reflection at the first electrode 803 the light has substantially the first circular polarization which will be mostly transmitted through the circular polarizing element 809. The transmission through the circular polarizing element 809 of the emitted light 814 is higher than if the emitted light 814 is unpolarized, for example more than 50% higher and up to 100% higher. The appliance 800 can therefore provide the advantageous low reflectivity to ambient light through use of the circular polarizing element, without the circular polarizing element reducing the extraction of emitted light from the light emitting device.

From the above description, it is manifested that various techniques may be used for implementing the concepts described in the present application without departing from the scope of those concepts. Moreover, while the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

What is claimed is:

1. A light emitting device comprising:
   a first electrode;
   a second electrode; and
   an emissive layer between the first and second electrodes, wherein:
   the emissive layer comprises quantum dots that are capable of producing circularly polarized luminescence, and
   the quantum dots comprise chiral structured perovskite quantum dots.

2. The light emitting device of claim 1, wherein the quantum dots each comprises a core having a chiral crystal structure.

3. The light emitting device of claim 1, wherein the quantum dots comprise only right-handed circularly polarized perovskite quantum dot enantiomers.

4. The light emitting device of claim 1, wherein the quantum dots comprise only left-handed circularly polarized perovskite quantum dot enantiomers.

5. The light emitting device of claim 1, wherein the quantum dots comprise a racemic mix of both right and left-handed circularly polarized quantum dot materials.

6. The light emitting device of claim 1, wherein the quantum dots comprise right-handed circularly polarized perovskite quantum dots dispersed in a matrix of cross-linked charge transport molecules.

7. The light emitting device of claim 1, wherein the quantum dots comprise left-handed circularly polarized perovskite quantum dots dispersed in a matrix of cross-linked charge transport molecules.

8. The light emitting device of claim 1, wherein the quantum dots comprise a racemic mixture of left and right-handed circularly polarized perovskite quantum dots dispersed in a matrix of cross-linked charge transport molecules.

9. The light emitting device of claim 1, wherein the quantum dots each comprises a chiral quantum dot core formed of octahedral metal halide lattices interspersed with one or more organic chiral ligands.

10. The light emitting device of claim 1, further comprising a circular polarizer disposed over the emissive layer.

11. The light emitting device of claim 10, wherein the circular polarizer comprises a linear polarizer and a quarter wave ($\lambda/4$) retarder over the emissive layer.

12. The light emitting device of claim 2, further comprising a window and a circular polarizer between the window and the emissive layer, wherein the chiral crystal structure is configured so that light emitted from the emissive layer toward the window has a circular polarization that is substantially transmitted through the circular polarizer.

13. The light emitting device of claim 2, further comprising a circular polarizer disposed over the emissive layer, wherein the chiral crystal structure is configured so that light emitted from the emissive layer toward the first electrode has a first circular polarization such that the light after reflection by the first electrode has a second circular polarization that is not substantially transmitted through the circular polarizer.

14. A quantum dot comprising:
   a core; and
   one or more shell layers around the core, wherein:
   the core comprises a chiral crystal structure for producing circularly polarized luminescence, and
   the quantum dot comprises a chiral structured perovskite quantum dot.

15. The quantum dot of claim 14, wherein the chiral crystal structure of the quantum dot comprises only right-handed chiral structures to produce only right handed circularly polarized light.

16. The quantum dot of claim 14, wherein the chiral structured perovskite quantum dot comprises only left-handed chiral structures to produce only left handed circularly polarized light.

17. The quantum dot of claim 14, wherein the chiral crystal structure of the quantum dot comprises a racemic mix of both right and left-handed chiral structures to produce a mix of left and right handed circularly polarized light.

18. A quantum dot comprising:
   a core; and
   one or more shell layers around the core, wherein:
   the core comprises a chiral crystal structure for producing circularly polarized luminescence, and
   the core is formed of octahedral metal halide lattices interspersed with organic chiral ligands.

* * * * *